Aug. 10, 1965 L. SCHWARTZ ETAL 3,200,361

PRINTED CIRCUIT BOARD CONNECTOR ASSEMBLY

Filed July 20, 1962

2 Sheets-Sheet 1

INVENTORS
LEON SCHWARTZ
JACOB MUELLER

BY G. Donald Weber, Jr.

AGENT

Aug. 10, 1965 L. SCHWARTZ ETAL 3,200,361

PRINTED CIRCUIT BOARD CONNECTOR ASSEMBLY

Filed July 20, 1962

2 Sheets-Sheet 2

3,200,361
PRINTED CIRCUIT BOARD CONNECTOR ASSEMBLY

Leon Schwartz and Jacob Mueller, Philadelphia, Pa., assignors to Sperry Rand Corporation, New York, N.Y., a corporation of Delaware Filed July 20, 1962, Ser. No. 211,366
7 Claims. (Cl. 339—17)

Figures 1, 1A, 2:
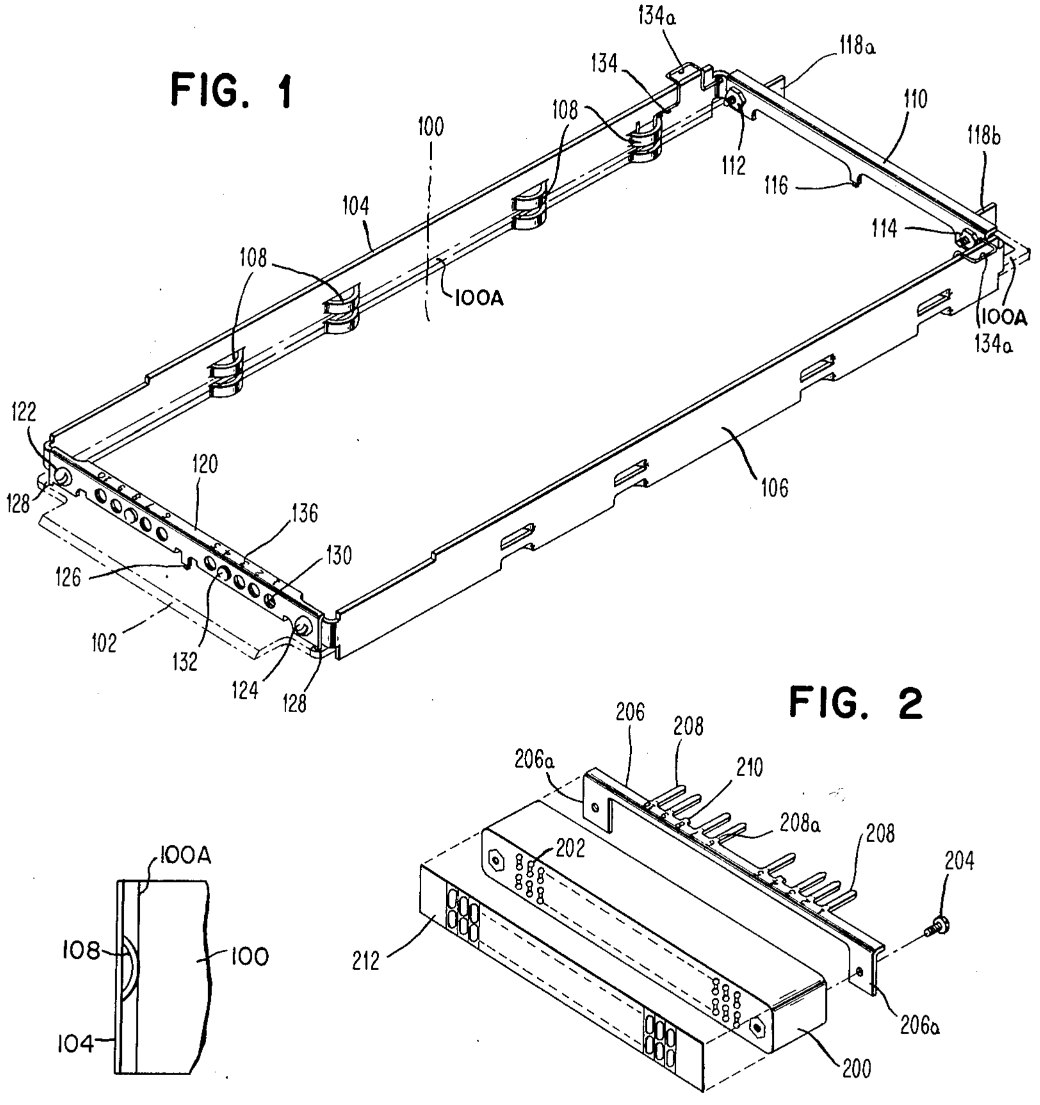

This invention relates to an assembly which is to be utilized with printed circuit cards or boards. More particularly, the assembly provides a preferred mounting arrangement for a circuit board. In addition, this invention utilizes a portion of the assembly to provide a means for coding different types of printed circuit boards which are used for predefined electrical functions.

It is the practice, at present, to fabricate a large number of electronic devices, such as television sets, radios, data processing machines, etc. in a modular form. That is, electrical connections between the various electronic components, such as vacuum tubes, semiconductors, passive circuit components, and the like, are made by means of printed circuitry. Thus, by using any of the well known manufacturing techniques, electrical conductors are laid down upon a non-conducting base member and the electrical conductors extend between various electrical junctions on the base member. In addition, these electrical conductors are connected to contact elements or lands which are typically located at one end of a substantially rectangular printed circuit board. These contact lands are placed in contact with other contact element, for example, receptacles or connector plugs, such that voltages and currents are transmitted to the components on the circuit board via the conductors. These circuit boards are often used in such a way that a device will have a plurality of the circuit boards arranged therein. A typical arrangement would have a plurality of the circuit boards stacked one above the other in a parallel arrangement. Many arrangements are used for mounting of the circuit boards. For example, a rack-like arrangement may be provided wherein a plurality of the circuit boards are inserted and form a plurality of removable shelves. Other schemes for circuit board mounting have been provided. However, many of these schemes leave much to be desired. Thus, the subject invention has been produced.

The subject invention provides a circumferential or peripheral frame or wall-like device which substantially surrounds the circuit board. The frame is made in a plurality of sections, different ones of which are attached to different sides of a circuit board which may typically be rectangular. The frame is so designed that in addition to supporting the circuit board, the frame imparts structural strength and rigidity to the circuit board and, in addition, provides certain circuit connections thereto. One of the frame sections is provided with selective coding means which interacts or engages with mating coding means attached to the connector assembly associated therewith. The connector assembly includes typical contact elements and a selective coding apparatus which interacts with or engages the aforementioned coding wall of the circuit board peripheral frame.

In particular, the coding apparatus as contemplated in a preferred configuration of the invention comprises two interacting components. One component has selectively removable portions thereby permitting selective provision of a plurality of holes or apertures in a selective or predetermined arrangement. The second component has a plurality of removable projections extending therefrom which projections may be removed in accordance with the predetermined hole arrangement in the first component such that the two components will interact or engage.

A more detailed description of the invention will be made subsequently. However, the brief summary of the invention is sufficient to indicate that one of the objects of this invention is to provide a circuit board mounting assembly.

Another object of this invention is to provide a circuit board mounting assembly which includes coding arrangements.

Another object of this invention is to provide an inexpensive circuit board mounting assembly by eliminating the necessity of high precision fabrication.

Another object of this invention is to provide an inexpensive modular coding arrangement for circuit board mounting.

Another object of this invention is to provide a modular circuit board assembly which permits rapid and easy replacement thereof.

Another object of this invention is to provide a circuit board mounting assembly which permits certain electrical connections between the circuit board and the mounting assembly.

Another object of this invention is to provide a circuit board mounting assembly which includes at least a portion thereof which is coded to identify the circuit board associated therewith.

Figure 3:
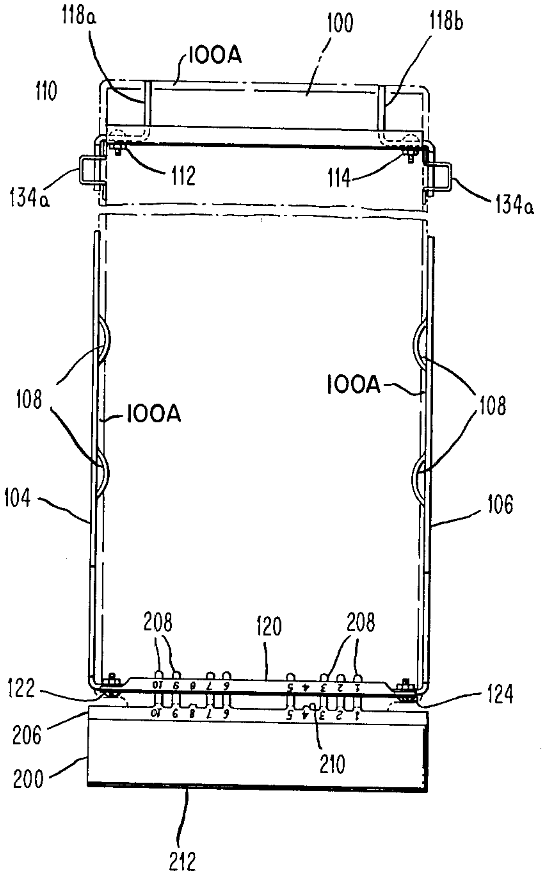

These and other objects and advantages of this invention will become more readily apparent in reading the detailed description of the invention in conjunction with the attached drawings in which:

FIGURE 1 is a perspective view of the circuit board mounting assembly portion comprising a frame around the circuit board and including a coded section;

FIGURE 1*a* is a fragmentary, top view of the frame shown in FIGURE 1 with a board having a ground strip or the like thereon;

FIGURE 2 is an exploded perspective view of the associated connector block including a coded section thereof; and FIGURE 3 is a top view of the assembly portions of FIGURES 1 and 2 in engagement.

Referring now to FIGURE 1, a printed circuit board 100 is suggested by dashed lines. For convenience and clarity, the actual circuit board and associated components have been eliminated. A typical rectangular printed circuit board may be on the order of 3⅜" x 9¼" overall. As shown, the circuit board 100 for example a laminated phenolic or epoxy paper, is disposed with the component bearing side up. That is, it will be seen that the suggested circuit board 100 resides below the median line of the surrounding frame whereby the wall portions extend farther above (for example ¼") the surface of the printed circuit board 100 than they do below it (for example 1/16"). The circuit board end portion 102 (again suggested by dashed lines) is the circuit board portion which would typically have mounted thereon the circuit lands or other similar means for applying signals to the circuit on the circuit board. The board end portion is reduced in width, on the order of 2¾", in order to mate with the connector assembly.

The side wall portions 104 and 106 are mirror images of each other. These frame portions may be fabricated of any desired material as, for example, plastic, phenolic, metal or the like. In the preferred embodiment, these side frame portions are fabricated of a cold rolled steel about 1/32" thick. Also, the effective dimensions of frame portions 104 and 106 may be about 7/16" x 8". In addition to supporting the printed circuit card, the use of a metal in the side walls provides an additional feature inasmuch as solder connections may be made between the frame and predetermined circuit locations on the circuit board to provide shielding and/or grounding conditions. A typical location for soldering the side wall portions 104 and 106 to the circuit board 100 is at the lower members of the associated pairs of cleats 108. This process may be made easier if the circuit board includes a metallic ground strip 100A around the periphery thereof (see FIGURE 1a). Strip 100A may be located on any of the top, bottom or side surfaces of the circuit board 100. The cleats 108 may be formed in the frame sidewalls by any conventional process as for example stamping or punching while the side wall portions are being fabricated. For illustrative purposes the cleats may be considered as stamped arcuate portions having a base dimension of about 1/4". The associated members of the pairs of cleats 108 are so disposed that the space between the two cleats in any pair is similar to the thickness of the circuit board 100 or on the order of 1/16" for example. Thus, it will be seen that the circuit board 100 will be inserted between the associated pairs of cleats 108 such that the side walls will engage the circuit board. If the soldering technique is utilized, the board and frame are more securely engaged.

The end wall portion 110 may have any preferred configuration and may be fabricated of a material similar to side walls 104 and 106. Thus, if side walls 104 and 106 are fabricated of a metal in order to form a ground connection, it is desirable to fabricate end wall 110 of a similar material to provide a continuous circuit path. In the configuration shown, frame end 110 comprises an L-shaped member (for strength) about 1/8" on each leg, and is attached to frame side-wall 104 by the nut and bolt combination 112. Frame end 110 is similarly attached to frame side wall 106 by the nut and bolt combination 114. Clearly other types of attachment may be made as for example spot-welding, roll pins or the like. A centrally located projection 116 of the end wall 110 may be attached to the circuit board 100 in the manner of a rivet by insertion into the circuit board. It should be apparent that projection 116 is not absolutely necessary but it does impart additional structural strength and rigidity to the circuit board assembly.

Projections 118a and 118b are shown extending beyond end wall 110 but again these elements are not required. The projecting elements 118a and 118b may be included in order to provide means for attaching a handle or other removal means to the circuit board assembly whereby easy access may be had to the individual circuit board for the insertion or removal thereof relative to the device in which the circuit board is to be utilized. Projections 118a and 118b may be extensions of the side walls 104 and 106, respectively, as shown in FIGURE 3 or, in the alternative, the projections may be portions of end wall 110.

The other end of the circuit board 100, viz. board end 102, is the board end which engages the associated connector plug, socket or the like. Furthermore, the coding arrangement is disposed at this end of the circuit board. Coded end wall portion 120 is mounted adjacent to board end 102. End wall 120 is generally of the same configuration as end wall 110. Moreover, end wall 120 is attached to side wall 104 and 106 by means of nut and bolt (or other attachment) combinations 122 and 124, respectively. Again a centrally located projection or peg 126 may be inserted in the circuit board 100 in order to impart greater strength to the assembly. Additionally, projections or pegs 128 may be provided at each end of frame side wall 120 (as well as end frame side wall 110) whereby the frame may be staked to the card if such a permanent attachment is desired.

Frame end wall 120 differs from frame end wall 110 inasmuch as frame end wall 120 includes a plurality of removable portions or "knock-out" sections 132. These sections are provided by scoring wall 120 during the stamping or other operation by which wall 120 is fabricated. Moreover, the scoring is so inscribed that segments or sections 132 can be removed only by applying force at the "interior" surface of the wall whereby an opening or hole 130 is produced. The application of force at the "exterior" surface of the wall is ineffectual to cause the removal of the knock out sections. The advantage of this construction will become apparent subsequently.

In FIGURE 1 there are shown ten possible openings or apertures. It is to be understood, of course, that the invention is not limited to a wall segment having only ten apertures but rather is meant to encompass a wall element having any number of apertures therein. It will be seen that by selectively punching out the removable section 132, a preconceived coding arrangement may be provided in the wall section 120 which coding arrangement will serve to identify the circuit boards associated with the wall mounting assembly. As will become more apparent subsequently, this coding arrangement may be used for external identification purposes, i.e. visual observation by the manipulator, or for internal (relative to the machine) identification by the modular contact plug or socket associated therewith.

That a significant coding arrangement may be provided by the holes or apertures in the wall element 120, may be seen by considering that a hole (or lack of a hole) may be considered as one of two possible conditions for each location. Thus, in the case presented, each of the ten aperture areas has two possible conditions. Thus, the number of coding combinations possible would be $2^{10}$. This number of combinations would amount to a separate coding arrangement for 1,024 different circuit boards. If the number of circuit boards to be utilized in any given device was to be significantly less or significantly more in number, the number of apertures could be altered to provide the desired number of combinations.

A further improvement to the invention which is not absolutely necessary to the invention but provides a preferred embodiment, is spring 134. It will be seen that there is a spring at each side of the circuit mounting assembly. One end of the spring is attached to the upper member of the last cleat pair by means of soldering or the like. The other end of spring 134 may be attached to or passed through a hole provided in end wall 110 for example. Generally, it will be found that spring 134 should be inserted after the attachment of the circuit board. The projecting portion 134a of the spring is designed to extend about 1/4" from the side walls and substantially parallel to the circuit board 100. These springs are utilized to provide a type of clamping action at the non-attached end of the circuit mounting assembly such that extreme precision in making the mounting rack for the mounting assembly may be eliminated. Furthermore, the springs permit a tight packing density for the mounted circuit boards while providing a type of vibration or shock mounting.

Referring now to FIGURE 2, there is shown a connector block or external contact which is associated with the circuit board and the associated mounting assembly described and shown in FIGURE 1. The main block 200 of the connector may be any of the typical connector blocks. This connector block may be fabricated of plastic, phenolic, or the like. The connector block shown is adapted to receive taper pin terminals. Thus, the receptacle 202 will receive any taper pin terminal. The connector block is, of course, not limited to connectors which receive taper pin terminals but a preferred embodiment is so constructed. A typical type of taper pin which may be utilized with the circuit is a #53 AMP Taper Pin which is received by the improved connector receptacle which forms the subject matter of the co-pending application of the instant inventors Leon W. Schwartz and Jacob Mueller. The co-pending application which was filed on July 20, 1962, is entitled Electrical Contact and has Serial Number 211,192. The suggested connectors and contacts, both terminals and receptacles, are not meant to be limitative of the invention but are rather meant to be suggestive of types of connectors which will operate properly with the connector block in question. However, the use of the circuit board mounting assembly and the coding arrangement is contemplated for use with connector blocks which are adapted for use with different types of connectors.

The code bar 206 is generally adapted to mount on the reverse side of the connector block 200 or the side of the connector block which receives the circuit board end 102 (see FIGURE 1). The configuration of the code bar 206 is not limited to that preferred somewhat U-shaped configuration shown. However, since the end 102 of circuit board 100 (see FIGURE 1) must engage the connectors at the rear surface of connector block 200, an opening must be provided therefor. Otherwise, code bar 206 comprises an L-shaped member, approximately 1/16" on each leg, fabricated of cold rolled steel, or the like. A suggested means for mounting the connector bar 206 to the circuit block 200 is by means of screws 204 which are used to engage tapped holes in connector block 200. These screws pass through holes in "ears" 206a to effect the mounting. Modifications of the suggested scheme may be utilized in mounting the connector bar 206 to the circuit block 200 without altering the inventive principles set forth. The coding arrangement of code bar 206 comprises the projections (or lack thereof) as shown. Projections 208 are formed as a part of the bar 206 during the fabrication thereof, as for example by stamping or the like. The projections 208 are scored 208a at the attached end thereof such that the projections may be readily removed or broken off by bending with a pair of pliers or the like. A removed projection is indicated at the locations 210 where a short stub or burr may remain. Of course, the burr may be removed by filling or the like so that no stub remains, but this operation is not crucial to the inventive concept set forth.

For purposes of coding the connector block 200 with regard to the terminal receptacles 202, a code strip 212 may be attached thereto. The code strip may be attached to the front surface of the block 200 by any means as for example any suitable adhesive. Normally, the code strip 212 is a strip of laminated Mylar but may in fact be any type of material desired as, for example, plastic. As suggested in the drawing, the code strip 212 may have a plurality of vertical strips thereon all of which may be differently colored (if the number of terminals is sufficiently small) or a color-code pattern may be determined and followed. Again, the inventive concepts set forth are not limited to a mounting assembly utilizing such a code strip but the code strip is suggested for purposes of improved usage.

Referring now to FIGURE 3 there is shown a top view of the assemblies shown in FIGURES 1 and 2. In particular, the connector assembly of FIGURE 2 is shown engaged with an end within the mounting assembly shown in FIGURE 1. Therefore, circuit board 100 (indicated by the dashed line) is shown attached to the side wall portions 104 and 106. As was discussed previously, the circuit board 100 is disposed between the upper and lower members of the associated pairs of cleats 108. Consequently, the upper cleats 108 are visible. The code bar or end wall portion 120 is attached to the side walls 104 and 106 by the nut and bolt combinations 122 and 124, respectively.

The connector assembly comprising connector block 200 with the code strip 212 affixed thereto is attached to the code bar 206 by means of screws 204. Thus the projections 208 appear in the same locations and the burrs or stubs 210 appear in the same location in both drawings.

It will be seen, that the contact portion 102 of the circuit board is inserted into the contact receptacle which is designed to accept the contact portion 102. In addition, the projections 208 extend through the apertures 130. As was stated supra, since the knockout segments 132 cannot be removed by the application of a force from the "exterior" side, any attempt to insert a connector having a code bar on which projections are located where there are no apertures will meet with failure. Consequently, it will be seen that the designation of the code arrangement of projections (and no projections) and apertures (and no apertures) can be utilized to positively identify associated or mating connectors and circuit board assemblies. A mismatch of the code bars on the two assembly components will prohibit the insertion of an incorrect circuit board, with the associated mounting assembly, into a connector plug assembly where the board does not belong.

Thus, it may be seen that an improved mounting assembly may be utilized which has included therein a coding arrangement whereby printed circuit boards or the like may be properly placed and mounted in electronic devices utilizing such printed circuit boards. The proper placing and mounting is effected in terms of electrical and structural considerations. It is to be understood, of course, that certain modifications may be made in the actual structure of the above described device without departing from the inventive concepts set forth. For example, the coding arrangement need not be limited to the number of apertures and projections shown in the figures. Moreover, the identifying number designations 136 may be included or eliminated as desired in accordance with specific cost reductions required in manufacturing. Furthermore, it is to be clearly understood that the suggested dimensions or materials might be altered somewhat without altering in any way the inventive concept displayed.

The embodiments of the invention in which an exclusive property or privilege is claimed are defined as follows:

1. In combination,
a printed circuit board,
a peripheral wall substantially surrounding said printed circuit board,
at least one section of said wall having a plurality of apertures therein,
said apertures being arranged in a predetermined pattern to effect a coded arrangement,
a connector capable of being engaged with said circuit board, and
a code bar attached to said connector,
said code bar including a plurality of projections aligned with said apertures when said connector and said circuit board are engaged.

2. In a mounting assembly for a printed circuit board,
a peripheral wall having a plurality of sections,
said wall sections connected together in order to surround the component-bearing portion of a printed circuit board,
at least one of said wall sections having a plurality of apertures therein,
said apertures being arranged in a predetermined pattern to effect a coded arrangement,
a connector assembly, and
a code bar connected to said connector assembly,
said code bar including a plurality of projections which mate with said apertures when said connector and a circuit board are engaged.

3. In combination,
a printed circuit board,
a peripheral wall surrounding a major portion of said printed circuit board,
said wall and said circuit board having at least one electrical connection therebetween,
at least one section of said wall having a plurality of selectively removable portions to permit the formation of apertures therein,
said apertures being arranged in a predetermined pattern to effect a coded arrangement,
a connector, and
a code bar connected to said connector, said code bar including a plurality of selectively removable projections extending therefrom,
said projections being aligned with said apertures when said connector and said circuit board are engaged.

4. In combination,
a printed circuit board, a metallic peripheral wall substantially surrounding said printed circuit board, said wall and said circuit board having at least one electrical connection therebetween such that said wall provides a common connection and shield, at least one section of said wall having a plurality of selectively removable portions to permit the formation of apertures therein, said removable portions being provided in a predetermined pattern such that apertures formed therefrom may be arranged in accordance with a predetermined pattern to effect a coded arrangement, a connector, a code bar connected to said connector, said code bar including a plurality of selectively removable projections extending therefrom, said projections being aligned with said apertures when said connector and said circuit board are engaged whereby said connector and said circuit board may be properly matched, and a code strip adapted for attachment to one surface of said connector, said code strip comprising a plurality of different color stripes for electrical wiring identification purposes.

5. A circuit board mounting assembly comprising, a peripheral wall having a plurality of metallic segments so connected to encompass substantially all of a printed circuit board, each of said wall segments including means for attaching said segment to said printed circuit board, said attaching means including arcuate indentations in said wall segments, at least one of said wall segments including sections thereof which may be selectively removed to form apertures in a coded arrangement, said removable sections being so arranged as to be resaid removable sections being so arranged as to be reonly, and a code bar adapted for attachment to a connector element which selectively engages said circuit board, said code bar including a plurality of selectively removable projections which are aligned with said removable sections such that an identification scheme may be achieved by selectively removing only one of the associated projections and removable sections.

6. In combination, a printed circuit board, a peripheral wall surrounding all of said printed circuit board except the external connection portion thereof, said wall and said circuit board having at least one electrical connection therebetween, at least one section of said wall having a plurality of selectively removable portions to permit the formation of apertures therein, said apertures being arranged in a predetermined pattern to effect a coded arrangement, a connector for engaging the external connection portion of said circuit board, a code bar connected to said connector, said code bar including a plurality of selectively removable projections extending therefrom, said projections being aligned with said apertures when said connector and said circuit board are engaged, and resilient means attached to said peripheral wall to facilitate mounting thereof in a mounting rack.

7. The combination called for in claim 1 wherein said printed circuit board includes a portion thereof adapted for bearing electrical components and a connector-contacting portion, said peripheral wall surrounding only said component bearing portion.

References Cited by the Examiner

UNITED STATES PATENTS

| | | | |
|---|---|---|---|
| 2,122,819 | 7/38 | Lazich | 339—185 X |
| 2,281,958 | 5/42 | Snavely | 339—184 X |
| 2,864,977 | 12/58 | Witt et al. | 339—17 X |
| 2,887,525 | 5/59 | Lewus | 174—52 |
| 2,945,989 | 7/60 | Vogel et al. | 339—17 X |
| 2,946,033 | 7/60 | Wirth | 339—184 X |
| 2,958,014 | 10/60 | Blain | 317—101 |
| 2,976,510 | 3/61 | Blain | 339—17 |
| 2,993,187 | 7/61 | Bisbing et al. | 339—17 |

JOSEPH D. SEERS, *Primary Examiner.*

ALFRED S. TRASK, *Examiner.*

UNITED STATES PATENT OFFICE

CERTIFICATE OF CORRECTION

Patent No. 3,200,361 August 10, 1965

Leon Schwartz et al.

It is hereby certified that error appears in the above numbered patent requiring correction and that the said Letters Patent should read as corrected below.

Column 7, line 37, for "said removable sections being so arranged as to be re-" read -- movable from one side of the associated wall segment --.

Signed and sealed this 22nd day of February 1966.

(SEAL)
Attest:

ERNEST W. SWIDER
Attesting Officer

EDWARD J. BRENNER
Commissioner of Patents